United States Patent
Tanaka et al.

[19]

[11] Patent Number: 6,133,163

[45] Date of Patent: Oct. 17, 2000

[54] METHOD FOR FORMING A SEMICONDUCTOR MULTILAYER INTERCONNECT DEVICE USING SOG AND POLYIMIDE

[75] Inventors: Tsuyoshi Tanaka; Yasushiro Nishioka, both of Ibaraki, Japan

[73] Assignee: Texas Instruments Incorporated, Dallas, Tex.

[21] Appl. No.: 08/751,793

[22] Filed: Nov. 18, 1996

Related U.S. Application Data

[62] Division of application No. 08/509,000, Jul. 28, 1995, abandoned.

[30] Foreign Application Priority Data

Jul. 29, 1994 [JP] Japan .................................. 6-178818

[51] Int. Cl.[7] .................................................. H01L 21/31
[52] U.S. Cl. ........................ 438/782; 438/761; 438/778; 438/780; 438/787; 438/789
[58] Field of Search ..................................... 437/195, 190, 437/231; 438/761, 778, 780, 782, 787, 789

[56] References Cited

U.S. PATENT DOCUMENTS

| | | | |
|---|---|---|---|
| 4,986,878 | 1/1991 | Malazgirt et al. | 156/643 |
| 5,004,704 | 4/1991 | Maeda et al. | 437/195 |
| 5,077,234 | 12/1991 | Scoopo et al. | 437/67 |
| 5,166,101 | 11/1992 | Lee et al. | 437/238 |
| 5,278,103 | 1/1994 | Mallon et al. | 437/240 |
| 5,631,197 | 5/1997 | Yu et al. | 438/699 |
| 5,849,640 | 12/1998 | Hsia et al. | 438/734 |
| 5,861,345 | 1/1999 | Chou et al. | 438/763 |
| 5,970,376 | 10/1999 | Chen | 438/637 |

FOREIGN PATENT DOCUMENTS 0365854  9/1989  European Pat. Off. .

OTHER PUBLICATIONS

Wolf et al., Silicon Processing For The VLSI Era, vol. 2, Lattice Press, 1990, pp. 222–236.

Wang et al., "A Study Of Plasma Treatments On Siloxane SOG", VMIC Conference, pp. 101–107, Jun. 7–8, 1994.

Shinichi et al., "Application of Surface Reformed Thick Spin–On–Glass To MOS Device Planarization", J. Electrochem. Soc., vol. 137, No. 4, Apr. 1990.

Matsuura et al., "An Advanced Interlayer Dielectric System With Partially Converted Organic SOG By Udsing Plasma Treatment", VMIC Conference, Jun. 8–9, 1993.

*Primary Examiner*—John F. Niebling
*Assistant Examiner*—Lynne A. Gurley
*Attorney, Agent, or Firm*—William B. Kempler; Frederick J. Telecky, Jr.

[57] ABSTRACT

The method of forming a highly reliabile multilayer interconnect in a semiconductor device is discussed. After forming a metal interconnect 2 on a substrate 1, a polyimide precursor is coated using a spinner 3. A fully integral polyimide film is then formed by treatment such as baking at a prescribed temperature.

6 Claims, 3 Drawing Sheets

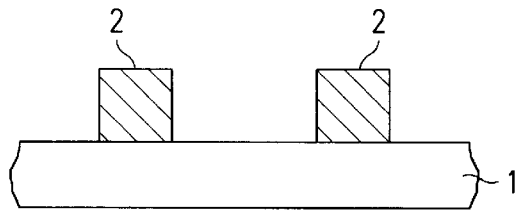
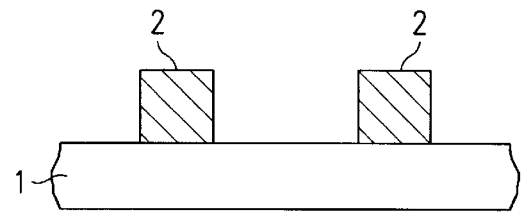
FIG. 1a          FIG. 2a
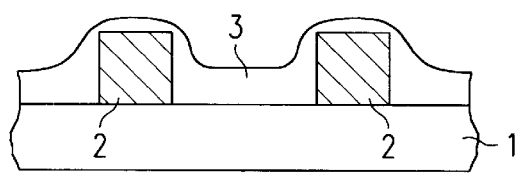
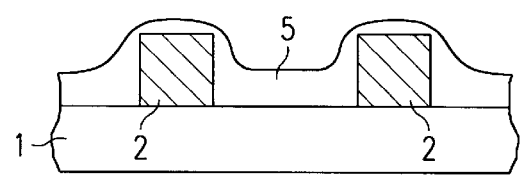
FIG. 1b          FIG. 2b
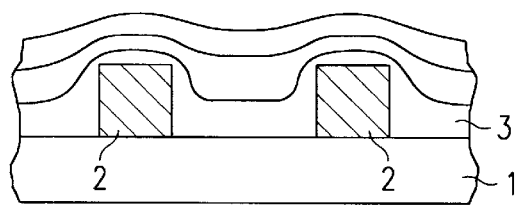
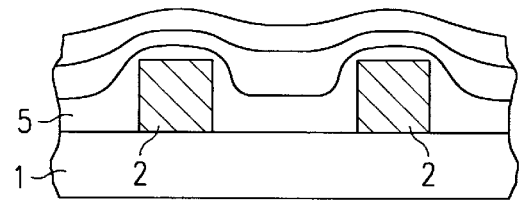
FIG. 1c          FIG. 2c
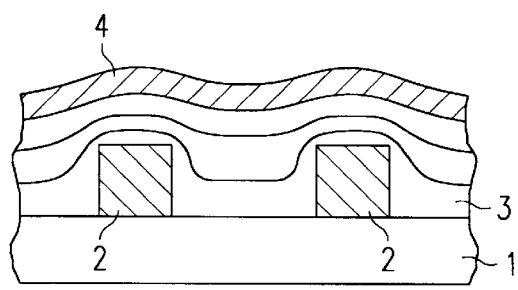
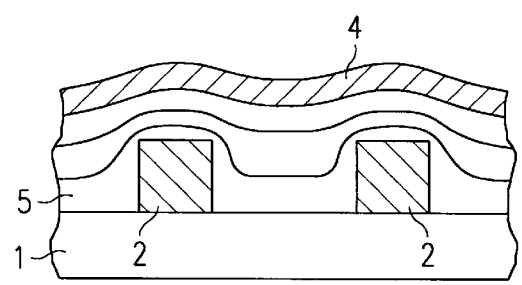
FIG. 1d          FIG. 2d

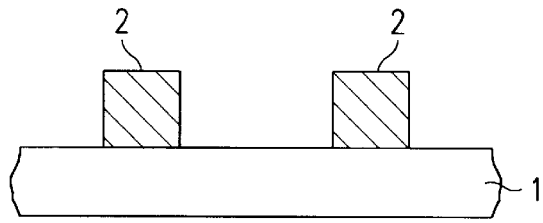
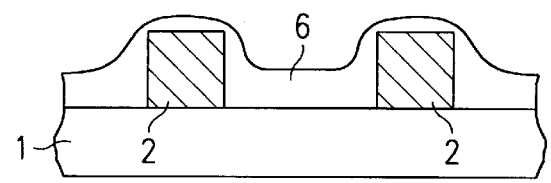
FIG. 5a    FIG. 5b
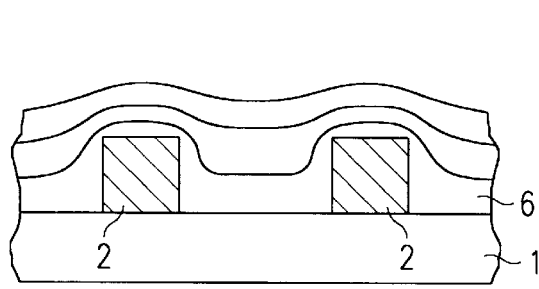
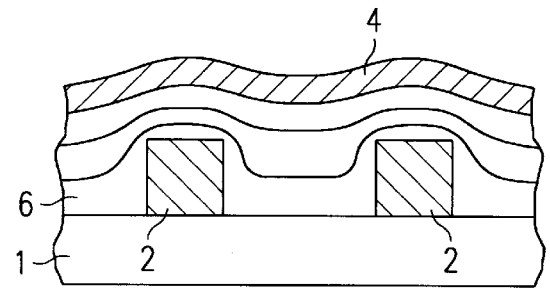
FIG. 5c    FIG. 5d
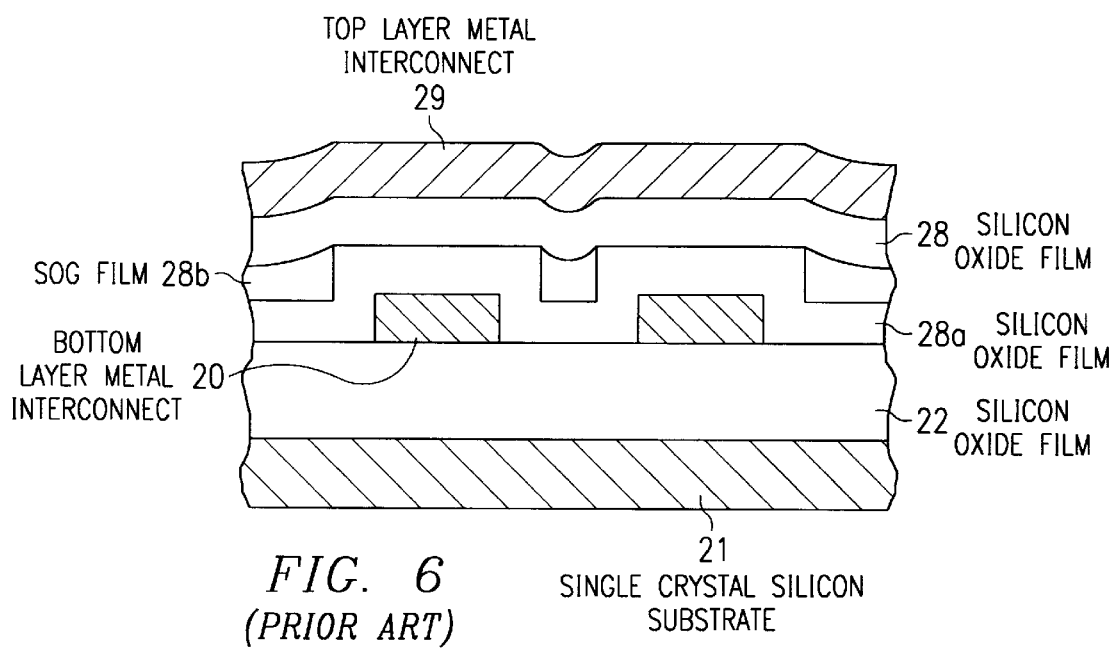
FIG. 6
(PRIOR ART)

METHOD FOR FORMING A SEMICONDUCTOR MULTILAYER INTERCONNECT DEVICE USING SOG AND POLYIMIDE

This application is a Divisional of application Ser. No. 08/509,000, filed Jul. 28, 1995, now abandoned.

FIELD OF THE INVENTION

This invention relates to semiconductor devices, and more particularly to a method for making a semiconductor device having multilayer interconnects with small static capacitance between interconnect lines.

BACKGROUND OF THE INVENTION

In the past, multilayer interconnects have been made increasingly finer as semiconductor devices have become more highly integrated. Japanese Laid-Open Patent 218,028/93 is a publicly known example relating to multilayer interconnects. There are many such examples in which normally, as shown in FIG. 6, an insulating film such as silicon oxide film 28 is used between the bottom layer metal interconnect lines.

In many such conventional multiple layer interconnect structures, the dielectric constant of silicon oxide film 28a is approximately 4, so that capacitance has been increasing between interconnect lines in recent devices, in which spacing between bottom layer metal interconnect lines 20 is becoming less than 1 micron as integration increases, causing undesirable phenomena such as degraded circuit operating speeds. The need has therefore arisen to use insulating materials with a low dielectric constant as an inter-layer insulating film. When these are applied to fine interconnects, however, a low viscosity precursor has to be used, since the [space] between the fine interconnect lines is filled, and a laminate structure is necessary for use with an inter-layer insulating film requiring a prescribed film thickness. There are problems, however, such as the occurrence of peeling at the time of multiple layering, difficulty in coating the precursor, etc.

BRIEF SUMMARY OF THE INVENTION

In one form of the present invention it has become possible in the multilayer interconnect forming process, when an insulating film containing a low dielectric constant organic material is formed by multiple layering, after spin coating the insulating film precursor and after evaporation of an organic solvent, etc. at below the temperature at which a polymer forms to form highly reliably multilayer interconnects by forming a second aforementioned insulating film precursor. Further, by repeating this process, it is possible to form a film thickness up to the desired film thickness. Such insulating films are even more effective when they contain [materials] with a lower dielectric constant than silicon oxide, such as spun-on glass (SOG) and polyimide, as constituent elements.

In another form of the present invention, it has become possible in the multilayer interconnect forming process to form a highly reliable multilayer interconnect when forming an insulating film containing a low dielectric constant organic material by multiple layering by 1) a process in which the surface is treated in argon plasma, after which a second aforementioned insulating film precursor is formed or, 2) treatment of the surface in oxygen plasma to form an oxide film on the surface of the first insulating film and a second aforementioned insulating film.

Such insulating films are even more effective when they comprise [materials] with a lower dielectric constant than silicon oxide, such as spun-on glass (SOG) and polyimide,

BRIEF DESCRIPTION OF THE DRAWINGS

FIG. 1 is a cross section showing steps (a)–(d) for making a semiconductor device according to a first embodiment of the invention.

FIG. 2 is a cross section showing steps (a)–(d) for making a semiconductor device according to a second embodiment of the invention.

FIG. 5 is a cross section showing steps (a)–(d) for making a semiconductor device according to a eighth and ninth embodiments of the invention.

FIG. 6 is a cross section of a prior art semiconductor device having multilayer interconnects.

Figure 3A:
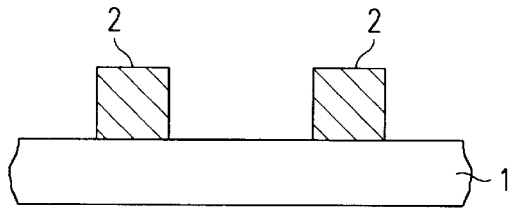
FIG. 3 is a cross section showing steps (a)–(d) for making a semiconductor device according to third and fourth embodiments of the invention.

In the figures, 1 is an insulating film substrate, 2 is a first metal interconnect, 3 is a polyimide, 4 is a second metal interconnect, 5 is organic SOG, and 6 is polytetrafluoroethylene (PTFE).

DETAILED DESCRIPTION

First we shall explain embodiments 1 and 2 of a first type (using spin coating), followed by embodiments 3 through 9 of a second type (using plasma processing).

Embodiment 1 (Polyimide)

FIGS. 1(a) to (d) are cross sections of the process sequence used to make a first embodiment of the invention. First at (a) a metal interconnect 2 is formed on an insulating film substrate 1. Then at (b) a polyimide 3 precursor is coated over the whole wafer surface at a rotational speed of 1000~5000 rpm using a spinner. A solvent is then evaporated, and baking is performed at 100~150 degrees C. This is then repeated until the desired film thickness is attained by successive coating (c). At this point no polymer is formed in the polyimide at this temperature level, and the surface is chemically active, so it becomes possible to do uniform successive coating.

Imidizing is then carried out at 200~250 degrees C., and at the end, a final cure is performed at 300~400 degrees C. During this final cure, polymerization of the polyimide occurs. This polymerization also occurs uniformly in the successively coated film, making it possible to form a polyimide film which is fully integral. As shown in (d), a metal interconnect 4 is then formed after making contact holes to connect metal interconnect 2 and metal interconnect 4. This method enables filling in fine interconnects without gaps and securing a desired film thickness, forming a highly reliable multilayer interconnect.

Embodiment 2 (Organic SOG)

In FIG. 2, cross sections (a)–(d) show a process for making multiple semiconductor interconnects according to a second embodiment of the invention. After forming a metal interconnect 2 on insulating film substrate 1 (a), an organic SOG 5 precursor is coated over the entire wafer surface at a rotational speed of 1000~5000 rpm using a spinner. A solvent is then evaporated at a temperature level such that polycondensation of the organic SOG polymer does not occur (b). This is then repeated until the desired film thickness is obtained by successive coatings (c). At that point, no polymer is formed in the organic SOG at this temperature level, and the surface is chemically active, so it becomes possible to do uniform successive coating.

Imidizing is then carried out at 200–250 degrees, and at the end a final cure is performed at 350–450 degrees C. During this final cure, polymerization of the organic SOG occurs; this polymerization also occurs uniformly in the successive coated film, making it possible to form an organic SOG film which is fully integral. Metal interconnect 4 is then formed after making contact holes to connect metal interconnect 2 and metal interconnect 4 (d). It is therefore possible by this method to fill in fine interconnects without gaps and to secure the desired film thickness, forming a highly reliable multilayer interconnect.

Embodiment 3 (Polyimide with Argon Plasma)

Figure 3B:
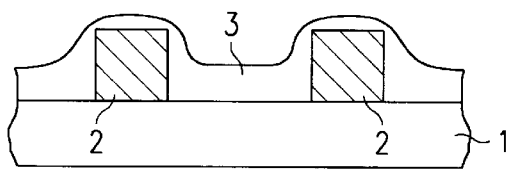
Figure 3C:
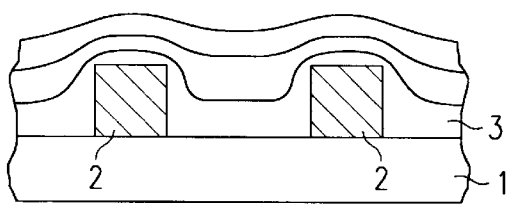
Figure 3D:
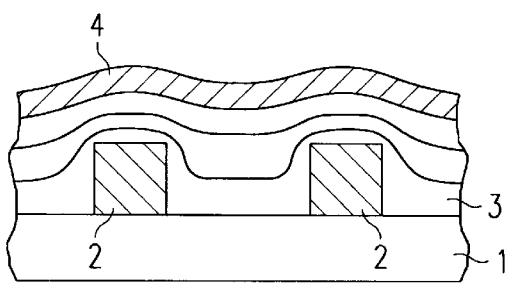

FIGS. 3(a) to (d) are cross sections of the process sequence used to explain Embodiment 3. First, at (a) a metal interconnect 2 is formed on an insulating film substrate 1. Then a polyimide 3 precursor is coated over the entire wafer surface at a rotational speed of 1000–5000 rpm using a spinner (b). Thereafter, in order to evaporate the solvent [the sample] is baked at 100–150 degrees C., then imidized at 200–250 degrees C., and, lastly, final cured at 300–400 degrees C. Exposure to the argon plasma then breaks the polyimide bonds on the surface and it becomes active. Adhesion when coating the second polyimide precursor is thus improved, and multiple layering becomes possible. This is then repeated until the desired film thickness is obtained. Metal interconnect 4 is then formed after making contact holes to connect metal interconnect 2 and metal interconnect 4 (d).

Embodiment 4 (Polyimide with Argon Plasma)

Since the process is similar to that of Embodiment 3, Embodiment 4 will be explained using FIGS. 3(a) through (d). First, after forming metal interconnect 2 on an insulating film substrate 1 (a), the polyimide 3 precursor is coated over the entire wafer surface at a rotational speed of 1000–5000 rpm using a spinner (b). Thereafter, in order to evaporate the solvent [the sample] is baked at 100–150 degrees C., then imidized at 200–250 degrees, and, lastly, final cured at 300–400 degrees. Exposure to the argon plasma then roughens the polyimide surface. Adhesion when coating the second polyimide precursor is thus improved, and multilayering becomes possible. This is then repeated until the desired film thickness is obtained. Metal interconnect 4 is then formed after making contact holes to connect metal interconnect 2 and metal interconnect 4 (d).

Embodiment 5 (Organic SOG with Argon Plasma)

Figure 4A:
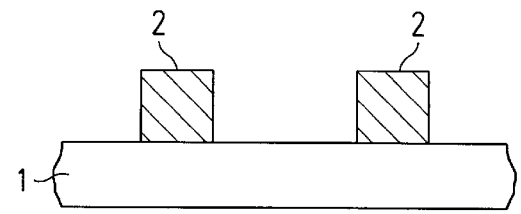
FIG. 4 is a cross section showing steps (a)–(d) for making a semiconductor device according to a fifth, sixth, and seventh embodiments of the invention.
Figure 4B:
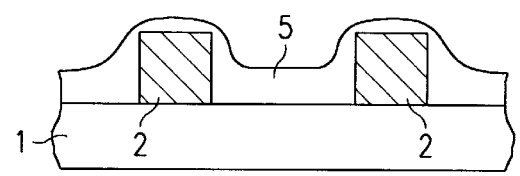
Figure 4C:
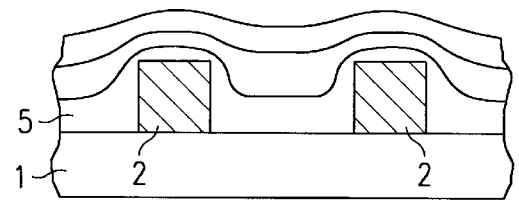
Figure 4D:
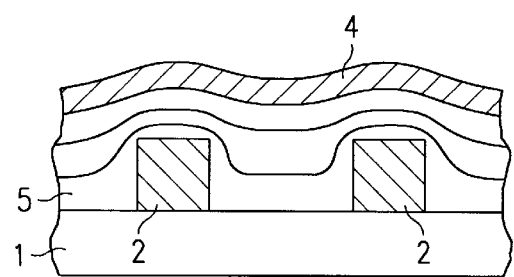

FIGS. 4(a) to (d) are cross sections of the process sequence used to explain Embodiment 5. First, after forming metal interconnect 2 on insulating film substrate 1 (a), the organic SOG 5 precursor is coated over the entire wafer surface at a rotational speed of 1000–5000 rpm using a spinner (b). Thereafter, in order to evaporate the solvent [the sample] is baked at 100–250 degrees C. (varies depending on the boiling point of the solvent) and, lastly, final cured at 350–400 degrees C. Exposure to the argon plasma then breaks the organic SOG bonds on the surface and it becomes active. Adhesion when coating the second organic SOG precursor is thus improved, and multiple layering becomes possible. This is then repeated until the desired film thickness is obtained. Metal interconnect 4 is then formed after making contact holes to connect metal interconnect 2 and metal interconnect 4 (d).

Embodiment 6 (Organic SOG Example) (With Argon Plasma)

Since the process is similar to that of Embodiment 5, Embodiment 6 will be explained using FIGS. 4(a) through (d). First, after forming metal interconnect 2 on an insulating film substrate 1 (a), the organic SOG 5 precursor is coated over the entire wafer surface at a rotational speed of 1000–5000 rpm using a spinner (b). Thereafter, in order to evaporate the solvent [the sample] is baked at 100–200 degrees C. (varies depending on the boiling point of the solvent) and, lastly, final cured at 350–450 degrees C. By then exposing it to argon plasma, the organic SOG surface is roughened. Adhesion at the time of coating the second organic SOG precursor is thus improved and multiple layering becomes possible. This is then repeated until the desired film thickness is obtained. Metal interconnect 4 is then formed after making contact holes to connect metal interconnect 2 and metal interconnect 4 (d).

Embodiment 7 (Organic SOG Example) (With Oxygen Plasma)

Since the process is similar to that of Embodiment 5, Embodiment 7 will be explained using FIGS. 4(a) through (d).

First, after forming metal interconnect 2 on an insulating film substrate 1 (a), the SOG 5 precursor is coated over the entire wafer surface at a rotational speed of 1000–5000 rpm using a spinner (b). Thereafter, in order to evaporate the solvent [the sample] is baked at 100–200 degrees C. (varies depending on the boiling point of the solvent) and, lastly, final cured at 350–450 degrees C. At this point, because the organic SOG surface is hydrophobic, the second organic SOG is repelled, and successive coating is difficult. The organic SOG surface is therefore exposed to RIE oxygen plasma and oxidized; by thus making it hydrophilic, successive coating becomes possible. At this point an extremely thin oxide film is formed, but the effect of this film on lowering of the dielectric constant is extremely small. This is then repeated until the desired film thickness is obtained. Metal interconnect 4 is then formed after making contact holes to connect metal interconnect 2 and metal interconnect 4 (d).

Embodiment 8 (PTFE with Argon Plasma)

FIGS. 5(a) to (d) are cross sections of the process sequence used to explain Embodiment 8. First, after forming metal interconnect 2 on insulating film substrate 1 (a), the polytetrafluoroethylene 6 precursor is coated over the entire wafer surface at a rotational speed of 1000–5000 rpm using a spinner (b). Thereafter, in order to evaporate the solvent [the sample] is baked at 100–200 degrees C. (varies depending on the boiling point of the solvent) and, lastly, final cured at 300–400 degrees C. Exposure to the argon plasma then roughens the polytetraflouroethylene surface. Adhesion when coating the second polytetraflouroethylene precursor is thus improved, and multiple layering becomes possible. This is then repeated until the desired film thickness is obtained. Metal interconnect 4 is then formed after making contact holes to connect metal interconnect 2 and metal interconnect 4 (d).

By means of the multiple layering technology of Embodiments 3 through 8 above, pinhole density in the film was dramatically reduced, and it became possible to prevent reductions in yield due to shorting between interconnect lines.

What is claimed is:

1. A method of forming a semiconductor device comprising the steps of:

a) providing a substrate having a first layer of metallization;

b) forming first a layer of organic SOG over said substrate and metallization at a rotation speed between 1000 RPM and 5000 RPM;

c) heating said first layer of organic SOG at a temperature between 100 degrees C. and 250 degrees C.;

d) heating said first layer of organic SOG at a temperature between 350 degrees C. and 400 degrees C.;

e) exposing said first layer of organic SOG to an Ar plasma to break the bonds on a surface of said first organic SOG layer; and f) forming a second layer of organic SOG over said first layer of organic SOG.

2. The method of claim 1 further comprising the step of forming a third layer of organic SOG over said second layer of organic SOG.

3. The method of claim 2 wherein said second layer of organic SOG is exposed to said plasma prior to the formation of said third layer of organic SOG.

4. The method of claim 2 wherein a second layer of metallization is formed over said third layer of organic SOG.

5. The method of claim 1 wherein said plasma is an argon plasma.

6. The method of claim 3 wherein said plasma is an argon plasma.

* * * * *